United States Patent
Tran

[19]

[11] Patent Number: 5,818,299
[45] Date of Patent: Oct. 6, 1998

[54] POWER MANAGEMENT IN A COMPUTER

[75] Inventor: Thanh T. Tran, Tomball, Tex.

[73] Assignee: Compaq Computer Corporation, Houston, Tex.

[21] Appl. No.: 511,138

[22] Filed: Aug. 4, 1995

[51] Int. Cl.⁶ .................................................. H03G 3/34
[52] U.S. Cl. ........................... 330/149; 381/94; 381/120; 380/51
[58] Field of Search .................... 330/51, 149; 381/94, 381/120, 123; 455/194.1, 144.2, 223

[56] References Cited

U.S. PATENT DOCUMENTS

| | | | |
|---|---|---|---|
| 3,840,820 | 10/1974 | Kawada | 330/51 X |
| 5,199,079 | 3/1993 | Anderson et al. | 330/51 X |
| 5,255,094 | 10/1993 | Yung et al. | 330/51 X |
| 5,424,678 | 6/1995 | Heyl et al. | 330/51 |

FOREIGN PATENT DOCUMENTS

| | | |
|---|---|---|
| 0 512 376 A2 | 11/1992 | European Pat. Off. . |
| 0 642 247 A2 | 3/1995 | European Pat. Off. . |
| WO 95/10894 | 4/1995 | WIPO . |

*Primary Examiner*—James B. Mullins
*Attorney, Agent, or Firm*—Fish & Richardson P.C.

[57] ABSTRACT

An apparatus is described for providing power management of a computer. The apparatus includes circuitry configured to assert a power down signal when a low power mode is to be entered and to de-assert the power down signal when the low power mode is to be exited. An audio amplifier has a power input and a mute input, and a switch is connected to the power input and configured to selectively supply power to the power input. A power down circuit is provided responsive to the power down signal and connected to the mute input and the switch such that when the power down signal is asserted, the power down circuit activates the mute input and subsequently closes the switch, and when the power down signal is de-asserted, the power down circuit open the switch and subsequently deactivates the mute input.

17 Claims, 3 Drawing Sheets

POWER MANAGEMENT IN A COMPUTER

BACKGROUND OF THE INVENTION

The invention relates to power management in a computer.

Power management is an important consideration in the design of modern personal computers. For effective power management, modern personal computers are designed to enter a low power mode after a certain period of inactivity. In order for a personal computer to be in compliance with the "Energy Star" industry standard, the computer must consume less than thirty watts of power in the low power mode.

A typical power management scheme for a personal computer is shown in prior art FIG. 1. A personal computer 1 is provided with a central processing unit (CPU) 2, a hard drive 3, an audio board 4, and a power supply 5. The computer 1 is connected to a monitor 6 for display purposes. The computer 1 is also provided with a power management integrated circuit (PMIC) 7 which controls transition into and out of low power mode. The PMIC 7 acts as a "watchdog", and powers down auxiliary components of the personal computer after a certain period of inactivity. This is achieved by issuing a signal to open one or more switches 8, resulting in removal of supply power from the auxiliary components, which in the example of FIG. 1 include the monitor 6, hard drive 3 and audio board 4. The PMIC 7 is provided to control the low power mode instead of vesting this responsibility in the CPU because the CPU itself requires a great deal of power. Therefore, when transition to low power mode occurs, the PMIC issues a signal to the CPU 2 causing the CPU to enter a low power mode. The PMIC 7 then remains active to detect activity such as entry on a keyboard or movement of a mouse (not shown), at which time PMIC 7 will "wake up" the CPU 2 and reactivate the auxiliary components of the computer.

SUMMARY OF THE INVENTION

In some aspects, the invention relates to an apparatus for power management in a computer, comprising: circuitry configured to assert a power down signal in connection with entering a low power mode; an audio amplifier having a mute input; a switch connected to selectively supply power to the audio amplifier; and a power down circuit responsive to the power down signal and connected to activate the mute input and subsequently open the switch when the power down signal is asserted by the power down circuit.

In some embodiments, the invention relates to the apparatus for power management in a computer, wherein the circuitry is configured to de-assert the power down signal in connection with exiting the low power mode, and wherein the power down circuit closes the switch and deactivates the mute input when the power down signal is de-asserted.

In some embodiments, the invention relates to the apparatus for power management in a computer, wherein a delay of at least 20 ms occurs between activation of the mute input and opening of the switch.

In some embodiments, the invention relates to the apparatus for power management in a computer, wherein a delay of at least 20 ms occurs between deactivation of the mute input and closing of the switch.

In some embodiments, the invention relates to the apparatus for power management in a computer, wherein the power down signal is a step function, and the power down circuit comprises means for converting the step function into a ramp function.

In some embodiments, the invention relates to the apparatus for power management in a computer, wherein the power down circuit generates a mute signal when a first voltage level is reached along the ramp function and for generating a delayed power down signal when a second voltage is reached along the ramp function.

In some embodiments, the invention relates to the apparatus for power management in a computer, wherein the power down signal is a step function, and wherein the power down circuit comprises: a delay circuit arranged to convert the step function into a ramp function; a reference voltage circuit configured to supply a first reference voltage and a second reference voltage; a first comparator arranged to generate a mute signal when the ramp function reaches the first reference voltage; and a second comparator arranged to generate a delayed power down signal when the ramp function reaches the second reference voltage.

In some embodiments, the invention relates to the apparatus for power management in a computer, wherein the delay circuit comprises a resistor and a capacitor.

In some embodiments, the invention relates to the apparatus for power management in a computer, wherein the reference voltage circuit comprises a voltage divider.

In some embodiments, the invention relates to the apparatus for power management in a computer, wherein the first reference voltage is greater than said second reference voltage.

In some embodiments, the invention relates to the apparatus for power management in a computer, wherein the first reference voltage is equal to approximately 2.4 volts, and the second reference voltage is equal to approximately 0.5 volts.

In some aspects, the invention relates to an apparatus for power management in a computer, comprising: circuitry configured to control entry into and exit from a low power mode; an audio amplifier having a mute input and a power input; a switch connected to selectively supply power to the power input; and an integrated circuit connected to the circuitry via a bus and connected to the mute input and the switch; wherein when the circuitry effects entry into the low power mode the integrated circuit activates the mute input and subsequently opens the switch, and when the circuitry effects exit from said low power mode, said integrated circuit closes the switch and subsequently deactivates the mute input.

In some embodiments, the invention relates to the apparatus for power management in a computer, and further comprises a delay between activation of the mute input and opening of the switch and between closing of the switch and deactivation of the mute input is at least 20 ms.

In some embodiments, the invention relates to an apparatus for power management in a computer, wherein the integrated circuit comprises an application specific integrated circuit.

In some aspects, the invention relates to a method for power management in a computer, comprising of steps of: in response to a low power mode signal, applying a mute signal to an audio amplifier to engage a mute function; and after a first delay following application of the mute signal, disconnecting power from said audio amplifier.

In some embodiments, the invention relates to the method for power management in a computer, further comprising the steps of: in response to deactivation of the low power mode signal, re-connecting power to the audio amplifier; and after a second delay following the reconnecting of power to the audio amplifier, deactivating the mute signal to disengage the mute function.

In some embodiments, the invention relates to the method for power management in a computer, wherein the first delay is at least 20 ms.

In some embodiments, the invention relates to the method for power management in a computer, wherein the second delay is at least 20 ms.

Advantages of the invention may include one or more of the following. Pops and clicks are reduced during transitions to and from low power mode. Muting of the audio amplifier is achieved without requiring significant additional power consumption. Other advantages and features will become apparent from the following description and from the claims.

DESCRIPTION OF THE PREFERRED EMBODIMENTS

Figure 2:
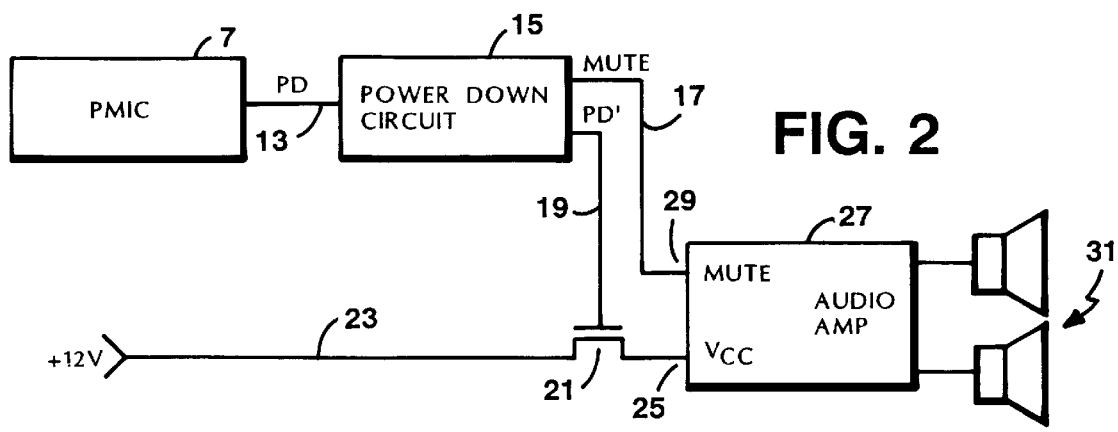
FIG. 2 is a block diagram in accordance with one embodiment of the invention.

Referring the FIG. 2, a mute signal and a delayed power down signal (PD') are derived from the power down signal (PD) issued by the PMIC. PMIC 7 issues the PD signal on line 13 to a power down circuit 15. In a manner described in more detail below, the power down circuit 15 generates the mute signal on line 17 and the delayed power down signal PD' on line 19. The delayed power down signal PD' is applied to a switch 21 that is arranged to selectively connect or disconnect a +12 volt supply on line 23 to $V_{cc}$ pin 25 of an audio amp 27. Switch 21 may be any type of conventional switch, including an N-channel power transistor or relay.

Figure 1:
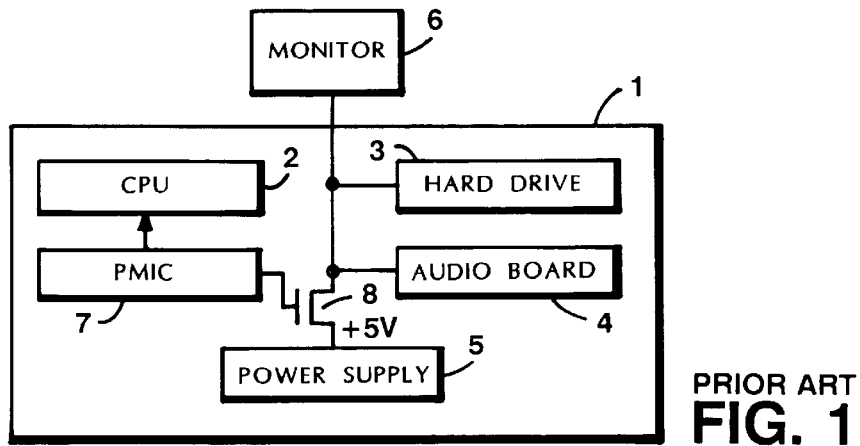
FIG. 1 is a block diagram showing a known power management scheme in a personal computer.

In the conventional power management scheme shown in FIG. 1, the PD signal from PMIC 7 is applied directly to the switch 8. Thus, when the PD signal is activated, switch 8 is opened and power is cut to the auxiliary components. This direct cutting of the power causes difficulties with respect to the audio board 4. Specifically, direct cutting of power to the audio amplifier on the audio board 4 causes clicks and pops to be heard through the speakers of the personal computer, which result from noises and transients within the audio amp. In the present invention as shown in FIG. 2, the PD signal is delayed to allow the mute signal to be applied to a mute pin 29 of the audio amp 27 prior to power being disconnected by the switch 21. Thus, the mute function is activated within the audio amp at the time switch 21 is opened, preventing clicks or pops from being heard through speakers 31.

During the power up sequence, the process is reversed. The mute signal on line 17 is deactivated after the delayed power down signal PD' on line 19 closes switch 21. Therefore, the audio amp remains muted until after power to the audio amp has been reestablished and all transients and noise have dissipated.

Figure 3:
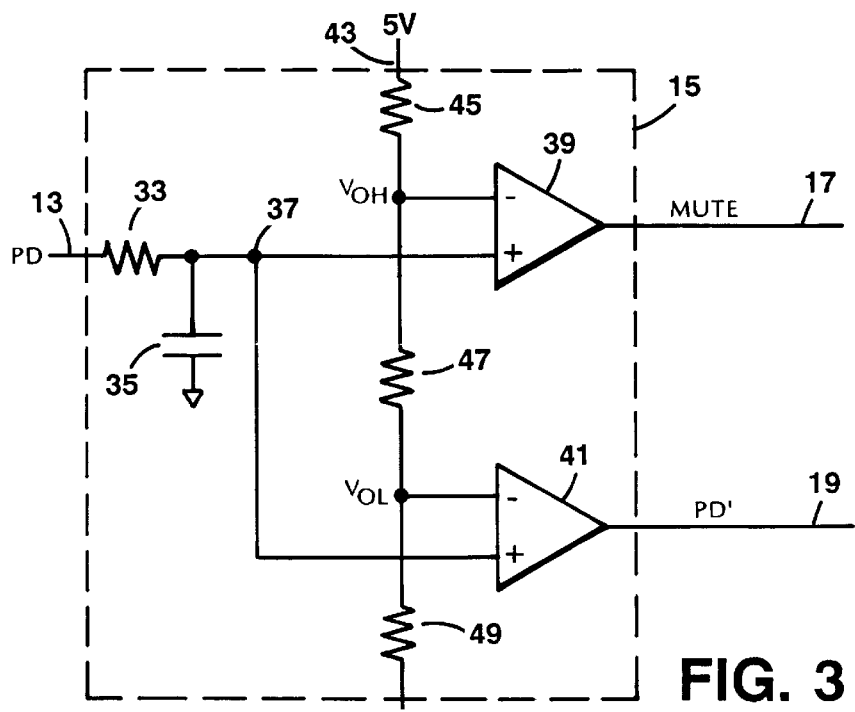
FIG. 3 is a schematic diagram in accordance with the embodiment of FIG. 2.

FIG. 3 shows power down circuit 15 in detail. The PD signal is applied to power down circuit 15 on line 13. The PD signal is active low, meaning that the low power mode is entered when the PD signal switches from a high state to a low state. Within the parameters relevant to this invention, the transition of the PD signal from high to low occurs instantaneously, i.e., as a step function. Resistor 33 and capacitor 35 on the input side of power down circuit 15 establish a time constant which converts the step function of the PD signal into a ramp function at point 37. This ramp function (PD(37)) is illustrated in the timing diagram of FIG. 4A. The values of resistor 33 and capacitor 35 can be chosen to produce a desired slope of the ramp function in accordance with well known engineering principles. Typical values would include 20 kΩ for resistor 33 and 1 μF for capacitor 35.

Figure 4A:
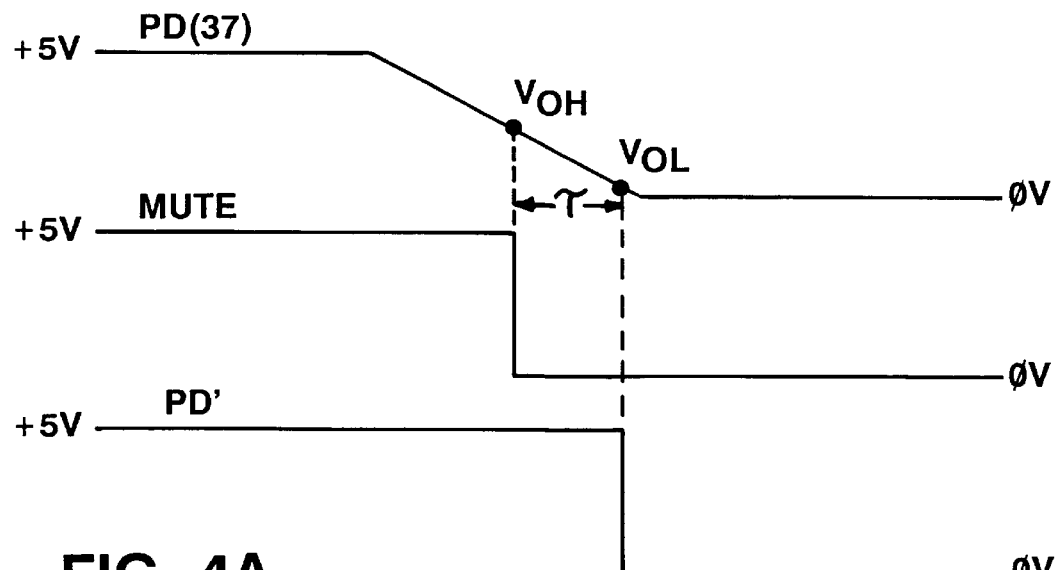
FIG. 4A is a timing diagram illustrating the power down sequence in accordance with the embodiment of FIG. 3.

The ramped PD signal at point 37 is applied to the positive input of two comparators 39, 41. The comparators may be any conventional comparator, such as the LM339. Reference voltages for the comparators are supplied from a +5 volt supply provided via line 43, which supplies a voltage divider comprising resistors 45, 47, and 49. The values of resistors 45, 47 and 49 are chosen to establish a first voltage $V_{OH}$ applied to the negative input of comparator 39 and a second voltage $V_{OL}$ applied to the negative input of comparator 41. As illustrated in FIG. 4A, voltages $V_{OH}$ and $V_{OL}$ are chosen to be points along the PD(37) ramp function, e.g., $V_{OH}$ is set to 2.4 volts, and $V_{OL}$ is set to 0.5 volts. The time τ along the PD(37) ramp function is chosen to be of sufficient duration to allow dissipation of any transients or noise in the audio amp 27, e.g., at least 20 ms. As the signal PD(37) ramps down from 5 volts, the output from comparator 39, which is the mute signal on line 17, is initially high because the voltage on the positive input of the comparator 39 is higher than the voltage on the negative input. When the signal PD(37) reaches the level of $V_{OH}$, the output of comparator 39 goes low. At this time, the output of comparator 41, which is the delayed power down signal PD' on line 19, is still high because the voltage on the positive input of comparator 41 is still higher than the voltage on the negative input. After the time τ, however, the voltage of PD(37) reaches $V_{OL}$, and the output of comparator 41 switches from high to low. Shortly thereafter, all of signals PD(37), the mute signal, and the PD' signal are at zero volts.

Referring back to FIG. 2, it is now apparent that when the PMIC issues the PD signal to enter low power mode, power down circuit 15 first generates the mute signal on line 17 to activate the mute function of the audio amp. A period of time τ later, which is sufficient to allow the mute function to become fully engaged and all noise and transients to dissipate, the delayed power down signal PD' is issued to open switch 21 and remove power from terminal 25 of the audio amp.

Figure 4B:
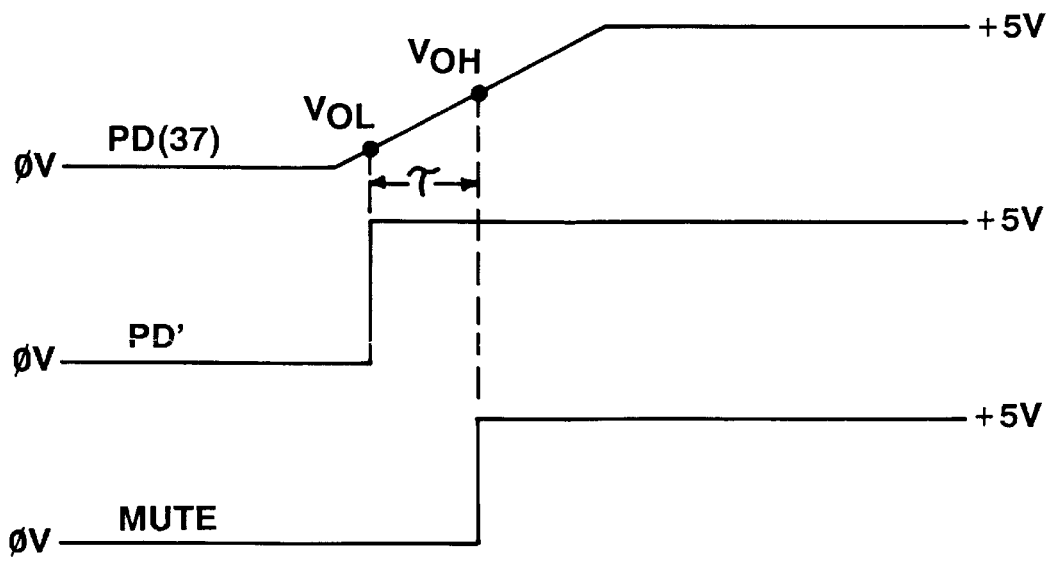
FIG. 4B is a timing diagram illustrating the power up sequence in accordance with the embodiment of FIG. 3.

Referring now to FIG. 4B, the opposite sequence occurs when leaving the power down mode. In this case, the CPU exits low power mode by switching PD signal on line 13 from low to high. As a result of the delay caused by resistor 33 and capacitor 35, this is converted into an upward ramp function PD(37) as shown in FIG. 4B. When signal PD(37) reaches the level $V_{OL}$, the delayed power down signal PD' output by comparator 41 switches from low to high, thus closing switch 21 and re-connecting power to the audio amp 27. A period of time T later, after all noise and transients have dissipated within the audio amp 27, the level $V_{OH}$ is reached, and the mute signal output by comparator 39 switches from low to high, thus disengaging the mute function of the audio amp 27. As a result, no undesirable sounds are emitted from speakers 31 in either the power down or the power up sequence.

Figure 5:
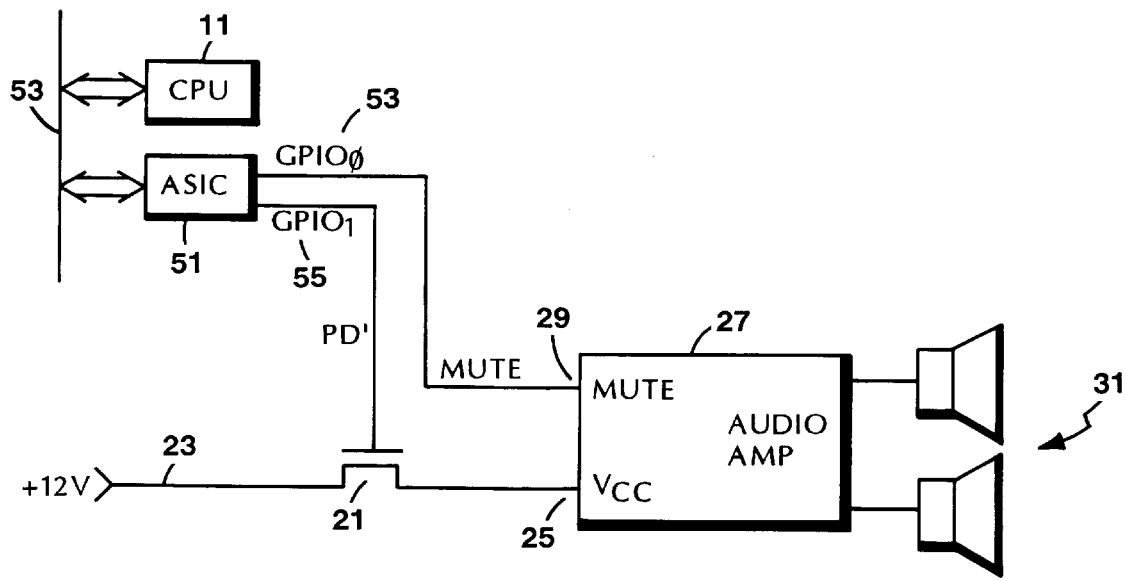
FIG. 5 is a block diagram in accordance with another embodiment of the invention.

An alternate embodiment of the invention is illustrated in FIG. 5. In this embodiment, the mute and PD' signals are issued under software control by the CPU 11. This embodiment of the invention requires the use of two general purpose input/output (GPIO) ports of an application specific integrated circuit (ASIC) 51 connected to CPU 11 via a bus 53. Software within CPU 11 causes ASIC 51 to issue the mute signal from GPIO0 53 and the delayed PD' signal from $GPIO_1$ 55 at the same timings described above with reference to FIGS. 4A and 4B. The end result is the same as the embodiment of FIG. 1. Namely, during the power down sequence, CPU 11 first causes ASIC 51 to issue the mute signal at port $GPIO_0$ to activate the mute function of audio amp 27. After the period of time r has elapsed, the CPU 11 causes ASIC 51 to issue the PD' signal at port $GPIO_1$, which opens switch 21 and removes power from the audio amp 27. During the power up sequence, the reverse sequence occurs in the manner described above with reference to FIG. 4B.

Figure 6A:
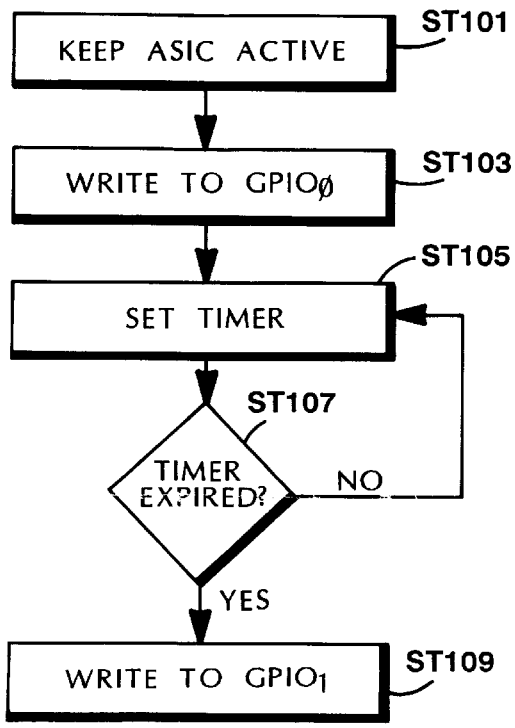
FIG. 6A is a flow chart of the power down sequence in accordance with the embodiment of FIG. 5.

FIG. 6A is a flow chart illustrating the software executed by CPU 11 during the power down sequence. In step ST101, the CPU 11 must keep the ASIC 51 active, i.e., make sure that the ASIC itself is not powered down when the low power mode is entered. In step ST103, CPU 11 writes to $GPIO_0$, causing the mute signal to go from high to low and the mute function of audio amp 27 to be activated. In step ST105, the CPU 11 sets an internal timer, which is a conventional feature of the CPU and is not shown in the drawings, equal to the desired time delay τ. In step ST107, the CPU 11 waits until the timer has expired. When it has, CPU 11 writes to $GPIO_1$ in ST109, causing the PD' signal to go low and thus switch 21 to be opened.

Figure 6B:
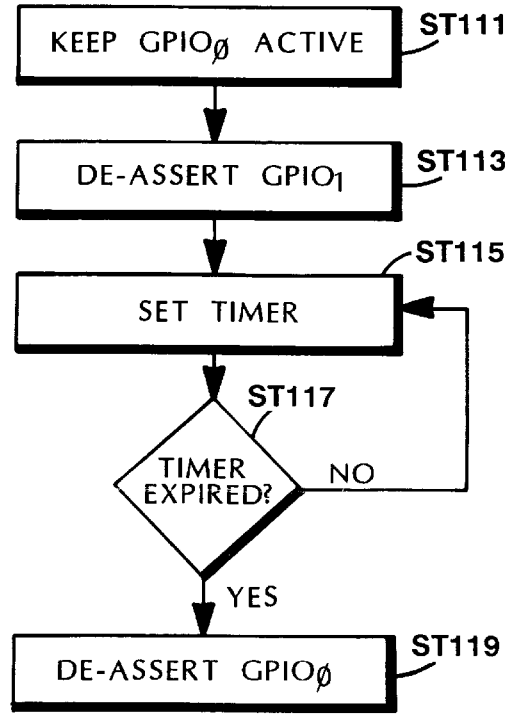
FIG. 6B is a flow chart of the power up sequence in accordance with the embodiment of FIG. 5.

FIG. 6B is a flow chart illustrating the software executed by CPU 11 during the power up sequence. In ST11, the CPU 11 makes sure that the output of $GPIO_0$ remains active, i.e., that the mute function of audio amp 27 remains engaged. In ST113, the output of $GPIO_1$ is de-asserted, causing the PD' signal to go high and switch 21 to be closed. The internal timer of the CPU 11 is set to the time τ in state ST115, and in state ST117 the CPU waits for the timer to expire. When the timer has expired, $GPIO_0$ is deasserted in state ST119, thus deactivating the mute function of audio amp 27.

Specific embodiments of the invention have been described above with reference to the accompanying figures. However, the invention is not limited to the specific embodiments, and rather is limited only by the scope of the appended claims.

What is claimed is:

1. An apparatus for power management in a computer, comprising:
   circuitry configured to assert a power down signal in connection with entering a low power mode:
   an audio amplifier having a mute input;
   a switch connected to selectively supply power to said audio amplifier; and
   a power down circuit responsive to said power down signal and configured to activate said mute input, effect a first minimum delay, and then open said switch when said power down signal is asserted by said power down circuitry;
   wherein said power down signal is a step function, and said power down circuit comprises means for generating said first minimum delay by converting said step function into a ramp function.

2. The apparatus of claim 1, wherein said circuitry is configured to de-assert said power down signal in connection with exiting the low power mode, and wherein said power down circuit closes said switch, effects a second minimum delay, and then deactivates said mute input when said power down signal is de-asserted.

3. The apparatus of claim 2, wherein the second minimum delay is of at least 20 ms.

4. The apparatus of claim 1, wherein the first minimum delay is at least 20 ms.

5. The apparatus of claim 1, wherein said power down circuit generates a mute signal when a first voltage level is reached along said ramp function and generates a delayed power down signal when a second voltage is reached along said ramp function.

6. An apparatus for power management in a computer, comprising:
   circuitry configured to assert a power down signal in connection with entering a low power mode;
   an audio amplifier having a mute input;
   a switch connected to selectively supply power to said audio amplifier; and
   a Power down circuit responsive to said power down signal and configured to activate said mute input, effect a first minimum delay, and then open said switch when said sower down signal is asserted by said power down circuitry, wherein said power down signal is a step function, and wherein said power down circuit comprises:
   a delay circuit arranged to convert said step function into a ramp function;
   a reference voltage circuit configured to supply a first reference voltage and a second reference voltage;
   a first comparator arranged to generate a mute signal when said ramp function reaches said first reference voltage; and
   a second comparator arranged to generate a delayed power down signal when said ramp function reaches said second reference voltage.

7. The apparatus of claim 6, wherein said delay circuit comprises a resistor and a capacitor.

8. The apparatus of claim 6, wherein said reference voltage circuit comprises a voltage divider.

9. The apparatus of claim 6, wherein said first reference voltage is greater than said second reference voltage.

10. The apparatus of claim 9, wherein said first reference voltage is equal to approximately 2.4 volts, and said second reference voltage is equal to approximately 0.5 volts.

11. An apparatus for power management in a computer, comprising:
    circuitry configured to control entry into and exit from a low power mode by generating a power down signal that is a step function;
    an audio amplifier having a mute input and a power input;
    a switch connected to selectively supply power to said power input; and
    an integrated circuit connected to said circuitry via a bus and connected to said mute input and said switch;
    wherein when said circuitry effects entry into said low power mode, said integrated circuit activates said mute input, converts said step function into a ramp function to effect a first minimum delay, and then opens said switch, and when said circuitry effects exit from said low power mode, said integrated circuit closes said switch, effects a second minimum delay, and then deactivates said mute input.

12. The apparatus of claim 11, wherein the first minimum delay and the second minimum delay are at least 20 ms.

13. The apparatus of claim 11, wherein said integrated circuit comprises an application specific integrated circuit.

14. A method for power management in a computer comprising the steps of:

in response to assertion of a lower power mode signal consisting of a step function, activating a mute signal to an audio amplifier to engage a mute function;

converting the step function into a ramp function to effect a first minimum delay following application of the mute signal; and disconnecting power from said audio amplifier.

15. The method of claim 14, further comprising the steps of:

in response to de-assertion of the low power mode signal, re-connecting power to the audio amplifier; and after effecting a second minimum delay following re-connection of power to the audio amplifier, deactivating the mute signal to disengage the mute function.

16. The method of claim 15, wherein said second minimum delay is at least 20 ms.

17. The method of claim 14, wherein said first minimum delay is at least 20 ms.

* * * * *